(12) United States Patent
Hata et al.

(10) Patent No.: US 7,548,425 B2
(45) Date of Patent: Jun. 16, 2009

(54) HEAT-RECEIVING APPARATUS AND ELECTRONIC EQUIPMENT

(75) Inventors: Yukihiko Hata, Hamura (JP); Kentaro Tomioka, Sayama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/875,737

(22) Filed: Oct. 19, 2007

(65) Prior Publication Data

US 2008/0259558 A1    Oct. 23, 2008

Related U.S. Application Data

(63) Continuation of application No. 11/083,267, filed on Mar. 17, 2005, now Pat. No. 7,301,771.

(30) Foreign Application Priority Data

Apr. 28, 2004    (JP) .............................. 2004-133535

(51) Int. Cl.
  *H05K 7/20* (2006.01)
(52) U.S. Cl. ..................... 361/699; 361/704; 361/719; 257/714; 165/80.4; 174/15.1
(58) Field of Classification Search ........................ None
See application file for complete search history.

(56) References Cited

U.S. PATENT DOCUMENTS

| | | | |
|---|---|---|---|
| 4,712,159 A | 12/1987 | Clemens | |
| 5,089,936 A | 2/1992 | Kojima et al. | |
| 5,168,926 A | 12/1992 | Watson | |
| 5,268,817 A | 12/1993 | Miyagawa et al. | |
| 5,283,468 A * | 2/1994 | Kondo et al. | 257/774 |
| 5,594,619 A | 1/1997 | Miyagawa et al. | |
| 5,631,497 A * | 5/1997 | Miyano et al. | 257/668 |
| 5,648,889 A | 7/1997 | Bosli | |
| 5,731,952 A | 3/1998 | Ohgami et al. | |
| 5,770,478 A | 6/1998 | Iruvanti et al. | |
| 5,901,035 A | 5/1999 | Foster et al. | |
| 5,903,436 A | 5/1999 | Brownell et al. | |
| 6,005,767 A | 12/1999 | Ku et al. | |
| 6,026,888 A | 2/2000 | Moore | |
| 6,049,459 A | 4/2000 | Edmonds et al. | |
| 6,050,785 A | 4/2000 | Horng | |
| 6,141,214 A | 10/2000 | Ahn | |
| 6,148,906 A | 11/2000 | Li et al. | |

(Continued)

FOREIGN PATENT DOCUMENTS

CN    12999993    1/2007

(Continued)

OTHER PUBLICATIONS

Japanese Office Action, Application No. 2004-133535, mailed Aug. 26, 2008 (English Translation).

*Primary Examiner*—Boris L Chervinsky
(74) *Attorney, Agent, or Firm*—Blakely, Sokoloff, Taylor & Zafman LLP

(57) ABSTRACT

A heat-receiving plate of a pump has a heat-receiving surface and a guide. The heat-receiving surface is thermally connected to a heat-generating body. The guide is provided on the heat-receiving surface. The guide is opposed to the heat-generating body.

20 Claims, 8 Drawing Sheets

U.S. PATENT DOCUMENTS

| | | | |
|---|---|---|---|
| 6,166,907 A | 12/2000 | Chien |
| 6,175,497 B1 | 1/2001 | Tseng et al. |
| 6,196,850 B1 | 3/2001 | Dietz et al. |
| 6,231,371 B1 | 5/2001 | Helot |
| 6,282,082 B1 | 8/2001 | Armitage et al. |
| 6,288,896 B1 | 9/2001 | Hsu |
| 6,296,048 B1 | 10/2001 | Sauer |
| 6,313,990 B1 | 11/2001 | Cheon |
| 6,327,145 B1 | 12/2001 | Lian et al. |
| 6,332,758 B1 | 12/2001 | Tang et al. |
| 6,333,847 B1 | 12/2001 | Katsui et al. |
| 6,377,452 B1 | 4/2002 | Sasaki et al. |
| 6,396,687 B1 | 5/2002 | Sun et al. |
| 6,408,937 B1 | 6/2002 | Roy |
| 6,418,017 B1 | 7/2002 | Patel et al. |
| 6,430,038 B1 | 8/2002 | Helot et al. |
| 6,437,973 B1 | 8/2002 | Helot et al. |
| 6,464,195 B1 | 10/2002 | Hildebrandt |
| 6,473,296 B2 | 10/2002 | Amemiya et al. |
| 6,477,871 B1 | 11/2002 | Shaw et al. |
| 6,483,445 B1 | 11/2002 | England |
| 6,510,052 B2 | 1/2003 | Ishikawa et al. |
| 6,519,143 B1 | 2/2003 | Goko |
| 6,519,147 B2 | 2/2003 | Nakagawa et al. |
| 6,519,148 B2 | 2/2003 | Nakagawa et al. |
| 6,532,152 B1 | 3/2003 | White et al. |
| 6,570,764 B2 | 5/2003 | Bhatia et al. |
| 6,594,149 B2 | 7/2003 | Yamada et al. |
| 6,611,425 B2 | 8/2003 | Ohashi et al. |
| 6,625,022 B2 | 9/2003 | Frutschy et al. |
| 6,625,024 B2 | 9/2003 | Mermet-Guyennet |
| 6,652,223 B1 | 11/2003 | Horng et al. |
| 6,654,234 B2 | 11/2003 | Landry et al. |
| 6,656,770 B2 | 12/2003 | Atwood et al. |
| 6,668,911 B2 | 12/2003 | Bingler |
| 6,702,007 B1 | 3/2004 | Pan et al. |
| 6,717,046 B2 | 4/2004 | Yanagisawa |
| 6,717,798 B2 | 4/2004 | Bell et al. |
| 6,728,102 B2 | 4/2004 | Ishikawa et al. |
| 6,741,465 B2 | 5/2004 | Holalkere et al. |
| 6,741,470 B2 | 5/2004 | Isenburg |
| 6,752,204 B2 | 6/2004 | Dishongh et al. |
| 6,755,626 B2 | 6/2004 | Komatsu et al. |
| 6,757,170 B2 | 6/2004 | Lee et al. |
| 6,768,637 B1 | 7/2004 | Amemiya |
| 6,774,870 B2 | 8/2004 | Mead, Jr. et al. |
| 6,779,894 B2 | 8/2004 | Shiraishi et al. |
| 6,785,128 B1 | 8/2004 | Yun |
| 6,804,115 B2 | 10/2004 | Lai |
| 6,808,371 B2 | 10/2004 | Niwatsukino et al. |
| 6,809,927 B2 | 10/2004 | Ohashi et al. |
| 6,809,930 B2 | 10/2004 | Mueller et al. |
| 6,829,139 B1 | 12/2004 | Duarte |
| 6,831,836 B2 | 12/2004 | Bhatia et al. |
| 6,839,234 B2 | 1/2005 | Niwatsukino et al. |
| 6,856,506 B2 | 2/2005 | Doherty et al. |
| 6,870,736 B2 | 3/2005 | Lee et al. |
| 6,873,521 B2 | 3/2005 | Landry et al. |
| 6,894,899 B2 | 5/2005 | Wu et al. |
| 6,924,978 B2 | 8/2005 | DiStefano |
| 6,927,978 B2 | 8/2005 | Arai et al. |
| 6,947,282 B2 | 9/2005 | Hotta et al. |
| 6,958,910 B2 | 10/2005 | Tanaka et al. |
| 6,983,789 B2 | 1/2006 | Jenkins et al. |
| 7,006,353 B2 | 2/2006 | Matteson |
| 7,016,195 B2 | 3/2006 | Ito et al. |
| 7,054,158 B2 | 5/2006 | Kimmich |
| 7,055,581 B1 | 6/2006 | Roy |
| 7,077,189 B1 | 7/2006 | Reyzin et al. |
| 7,079,394 B2 | 7/2006 | Mok |
| 7,086,452 B1 | 8/2006 | Senyk et al. |
| 7,095,614 B2 | 8/2006 | Goldmann |
| 7,124,811 B2 | 10/2006 | Crocker et al. |
| 7,143,815 B2 | 12/2006 | Lee et al. |
| 7,149,087 B2 | 12/2006 | Wilson et al. |
| 7,382,046 B2 * | 6/2008 | Tashiro et al. ............... 257/704 |
| 2002/0018337 A1 | 2/2002 | Nakamura |
| 2002/0053421 A1 | 5/2002 | Hisano et al. |
| 2002/0141159 A1 | 10/2002 | Bloemen |
| 2002/0192087 A1 | 12/2002 | Hsieh |
| 2003/0039097 A1 | 2/2003 | Igarashi |
| 2003/0124000 A1 | 7/2003 | Shih et al. |
| 2003/0142474 A1 | 7/2003 | Karidis et al. |
| 2003/0154598 A1 | 8/2003 | Shinotou |
| 2003/0214786 A1 | 11/2003 | Niwatsukino et al. |
| 2004/0001310 A1 | 1/2004 | Chu et al. |
| 2004/0027800 A1 | 2/2004 | Tanimoto et al. |
| 2004/0042176 A1 | 3/2004 | Niwatsukino et al. |
| 2004/0057197 A1 | 3/2004 | Hill et al. |
| 2004/0125566 A1 | 7/2004 | Lee et al. |
| 2005/0007739 A1 | 1/2005 | Gata et al. |
| 2005/0052833 A1 | 3/2005 | Tanaka et al. |
| 2005/0068732 A1 | 3/2005 | Tsuji |
| 2005/0105273 A1 | 5/2005 | Tanaka et al. |
| 2005/0111190 A1 | 5/2005 | Wang et al. |
| 2005/0117298 A1 | 6/2005 | Koga et al. |
| 2005/0164624 A1 | 7/2005 | Hisamatsu |
| 2005/0180105 A1 | 8/2005 | Matsushima et al. |

FOREIGN PATENT DOCUMENTS

| | | |
|---|---|---|
| EP | 0834795 | 4/1998 |
| JP | 55-158575 | 12/1980 |
| JP | 2-41472 | 3/1990 |
| JP | 06-334076 | 12/1994 |
| JP | 07-049725 | 2/1995 |
| JP | 07-142886 | 6/1995 |
| JP | 08/046097 | 2/1996 |
| JP | 10-004161 | 1/1998 |
| JP | 10-055227 | 2/1998 |
| JP | 10-261884 | 9/1998 |
| JP | 10/303582 | 11/1998 |
| JP | 11-039058 | 2/1999 |
| JP | 11-166500 | 6/1999 |
| JP | 2000-049478 | 2/2000 |
| JP | 2001-057490 | 2/2001 |
| JP | 2001-230356 | 8/2001 |
| JP | 2001-251079 | 9/2001 |
| JP | 2001-325164 | 11/2001 |
| JP | 2002-099356 | 4/2002 |
| JP | 2002151638 | 5/2002 |
| JP | 2002-344186 | 11/2002 |
| JP | 2002-353670 | 12/2002 |
| JP | 2003-044169 | 2/2003 |
| JP | 2003-068317 | 3/2003 |
| JP | 2003-101272 | 4/2003 |
| JP | 2003-172286 | 6/2003 |
| JP | 2003-216278 | 7/2003 |
| JP | 3431024 | 7/2003 |
| JP | 2003-233441 | 8/2003 |
| JP | 3452059 | 9/2003 |
| JP | 2003-343492 | 12/2003 |
| JP | 2004-047921 | 2/2004 |
| JP | 2004-218941 | 8/2004 |

* cited by examiner

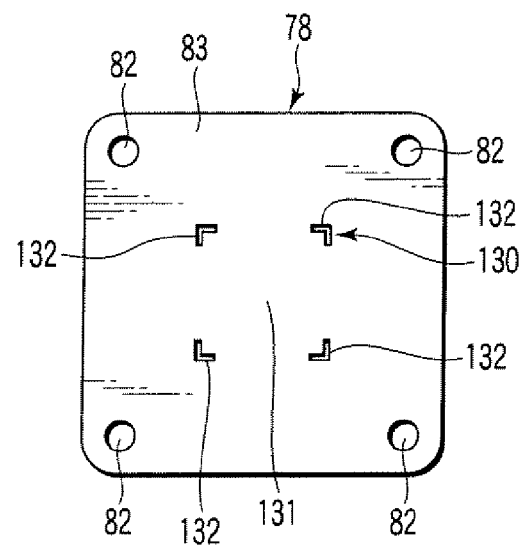
F I G. 8
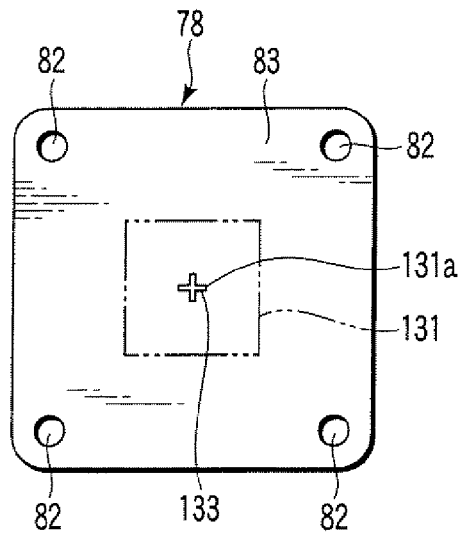
F I G. 9
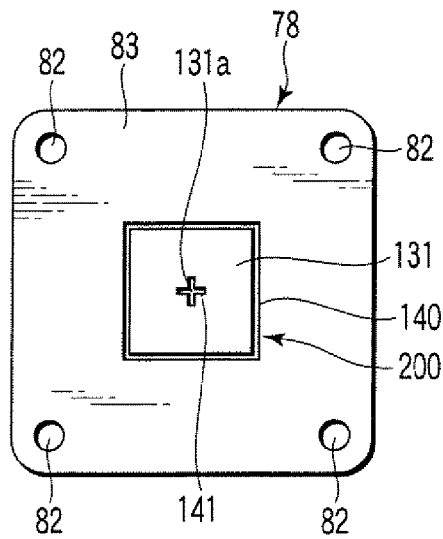
F I G. 10

HEAT-RECEIVING APPARATUS AND ELECTRONIC EQUIPMENT

CROSS-REFERENCE TO RELATED APPLICATIONS

This application is a continuation of U.S. patent application Ser. No. 11/083,267 filed Mar. 17, 2005, now U.S. Pat. No. 7,301,771, which is based upon and claims the benefit of priority from prior Japanese Patent Application No. 2004-133535, filed Apr. 28, 2004, the entire contents of which are incorporated herein by reference.

BACKGROUND OF THE INVENTION

1. Field of the Invention

The present invention relates to a heat-receiving apparatus having a heat-receiving surface which is thermally connected to a heat-generating body such as a CPU, and to an electronic equipment having such a heat-receiving apparatus.

2. Description of the Related Art

As the processing speed and the number of functions of CPU used in a portable computer are increased, the heat generated by the CPU during operation is increased. If the temperature of the CPU increases extremely, efficiency of the CPU operation is reduced. As a result, a problem occurs in the CPU, that is, the CPU itself fails.

As a measure for cooling a heat-generating body such as a CPU, there is known a heat-receiving apparatus such as a cold plate having a heat-receiving part which is thermally connected to a heat-generating body. The cold plate receives the heat of the heat-generating body. A heat-receiving part has a heat receiving surface which is thermally connected to the heat-generating body. The heat-receiving surface is bonded to the heat-generating body through a heat-conducting member, such as a heat-conducting silver paste or adhesive applied in the clearance above the heat-generating body. Such a heat-receiving apparatus has been disclosed in Jpn. Pat. Appln. KOKAI Publication No. 10-303582.

Generally, before applying a heat-receiving apparatus such as a cold plate to a heat-generating body, a heat-conducting member is provided in a heat-generating body packed on a printed circuit board. However, it is difficult for a certain heat-generating body to provide a heat-conducting member on its surface when packed on a printed circuit board, because the surface is obstructed by the surrounding electronic components.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 8 is a plan view of a heat-receiving surface according to a second embodiment of the present invention;

FIG. 9 is a plan view of a heat-receiving surface according to a third embodiment of the present invention;

FIG. 10 is a plan view of a heat-receiving surface according to a fourth embodiment of the present invention;

DETAILED DESCRIPTION OF THE INVENTION

A first embodiment of the present invention will be explained hereinafter based on the accompanying drawings FIG. 1 to FIG. 7.

Figure 1:
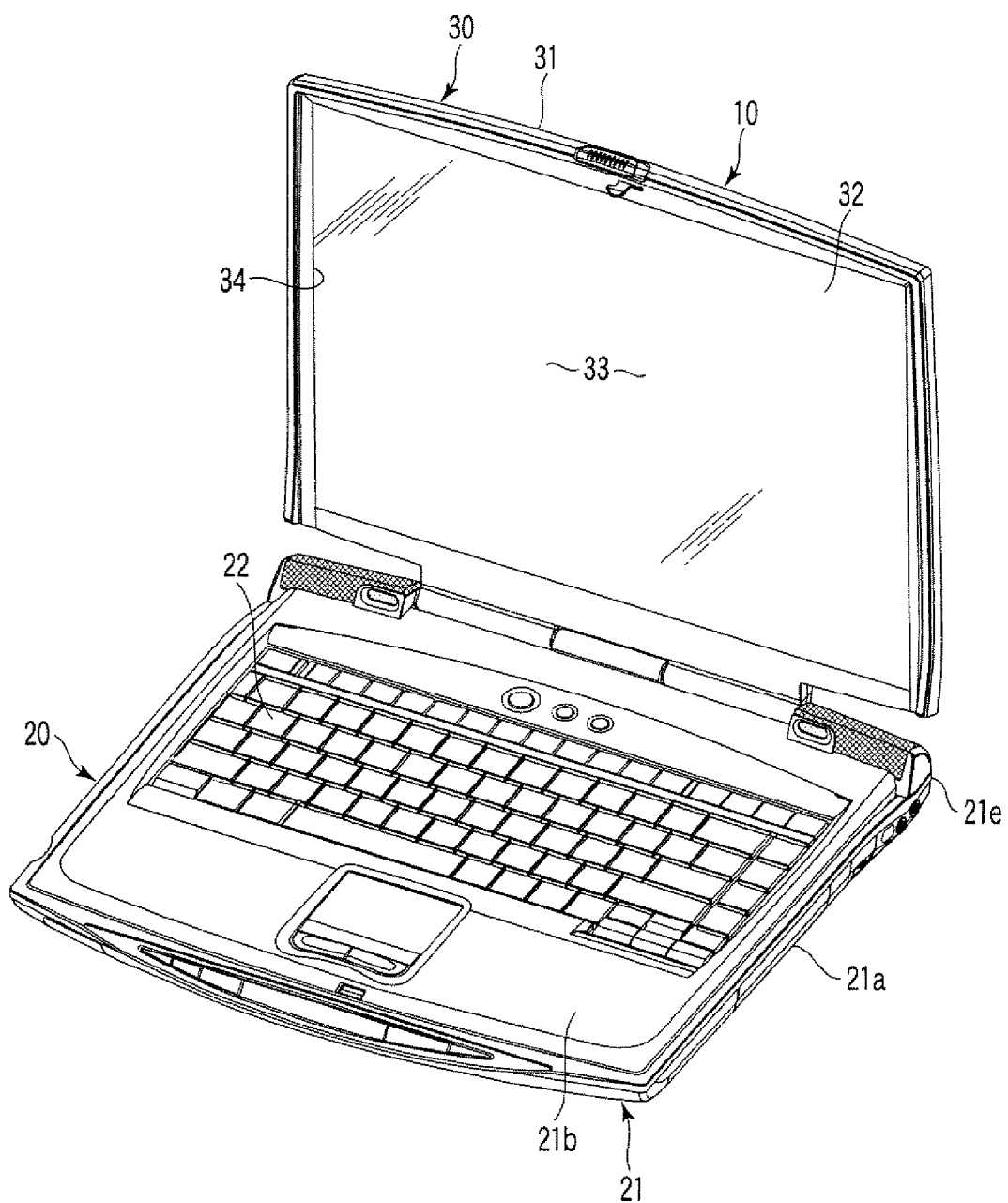
FIG. 1 is a perspective view of a portable computer according to a first embodiment of the present invention.

FIG. 1 shows a portable computer 10 as an electronic equipment. The portable computer 10 has a computer body 20 and a display unit 30. The computer body 20 has a flat box-shaped first housing 21. The first housing 21 has an upper wall 21b, a front wall, both sidewalls, rear wall and bottom wall 21a.

Figure 2:
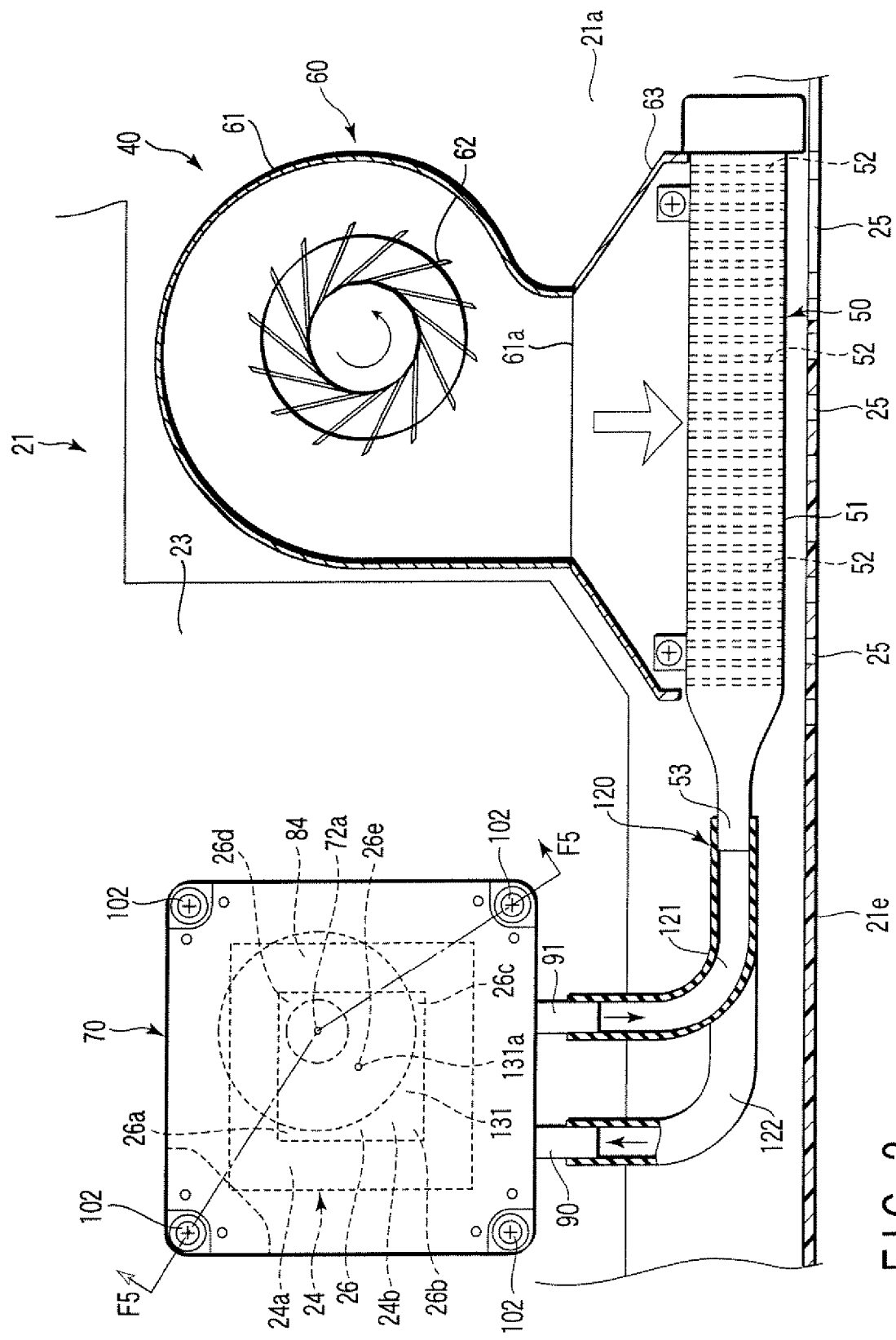
FIG. 2 is a plan view of a cooling apparatus contained in a first housing.

The upper wall 21b of the first housing 21 supports a keyboard 22. As shown in FIG. 2, several vents 25 are formed in the rear wall 21e of the first housing 21. As shown in FIG. 1, the display unit 30 has a second housing 31 and a liquid crystal display panel 32. The liquid crystal display panel 32 is contained in the second housing 31. The liquid crystal display panel 32 has a screen 33 to display an image. The screen 33 is exposed outward the second housing 31 through an opening 34 formed in the front side of the second housing 31.

The second housing 31 is supported at the rear end of the first housing 21 by a not-shown hinge. Thus, the display unit is movable between the closed position and opened position. At the closed position, the display unit 30 is laid over the computer body 20, covering the keyboard 22 from the upper direction. At the opened position, the display unit 30 is raised against the computer body 20 to expose the keyboard 22 and screen 33.

As shown in FIG. 2, the first housing 21 contains a printed circuit board 23. A CPU 24 is packed on the upper surface of the printed circuit board 23. The CPU 24 is an example of a heat-generating body. The CPU 24 has a base plate 24a and an IC chip 24b.

The IC chip 24b is located on the upper surface of the base plate 24a. The upper surface 26 of the IC chip 24b is shaped square, and has four corners 26a-26d. The upper surface 26 of the IC chip 24b is an example of a heat-connecting surface. The IC chip 24b generates a very large amount of heat during operation, as the processing speed is increased and the function is multiplied. Thus, the IC chip 24b needs to be cooled to maintain stable operation.

The computer body 20 contains a liquid-cooled cooling apparatus 40 to cool the CPU 24 by using a liquid refrigerant such as antifreezing solution. The liquid refrigerant is an example of refrigerant. The cooling apparatus 40 comprises a heat-radiating part 50, an electric fan 60, a pump 70, and a circulation route 120.

The heat-radiating part 50 is fixed to the bottom wall 21a of the first housing 21. The heat-radiating part 50 comprises a radiation body 51 and radiation fins 52. The radiation body 51 is made of a pipe extended along the width direction of the first housing 21 and folded up and down. Thus, the heat-radiating part 51 has an upper side passage and a lower side passage. The heat-radiation body 51 has a refrigerant entrance 53 and a refrigerant exit (not shown) in one end side of the length direction. The refrigerant entrance 53 is provided in the upper side passage. The refrigerant exit is provided in the lower side passage. The lower side passage is laid under the upper side passage. Liquid refrigerant flows in the inside of the radiation body 51.

The radiation fins 52 are made of metal material with excellent thermal conductivity, such as aluminum alloy and copper. The radiation fins 52 are provided in parallel each other along the longitudinal direction between the upper side passage and lower side passage. The radiation fins 52 are thermally connected to the radiation body 51.

The electric fan 60 sends cooling air to the heat-radiating part 50. The electric fan 60 is located immediately in front of the heat-radiating part 50. The electric fan 60 has a fan casing 61, and a centrifugal impeller 62 contained in the fan casing 61. The fan casing 61 has an exhaust port 61a to exhaust the cooling air. The exhaust port 61a is connected to the heat-radiating part through an air guide duct 63.

The impeller 62 is driven by a not-shown motor, when the portable computer 10 is powered or the CPU 24 is heated to a predetermined temperature. The impeller 62 is rotated, and a cooling air is supplied to the heat-radiating part 50 from the exhaust port 61a of the fan casing 61.

Figure 3:
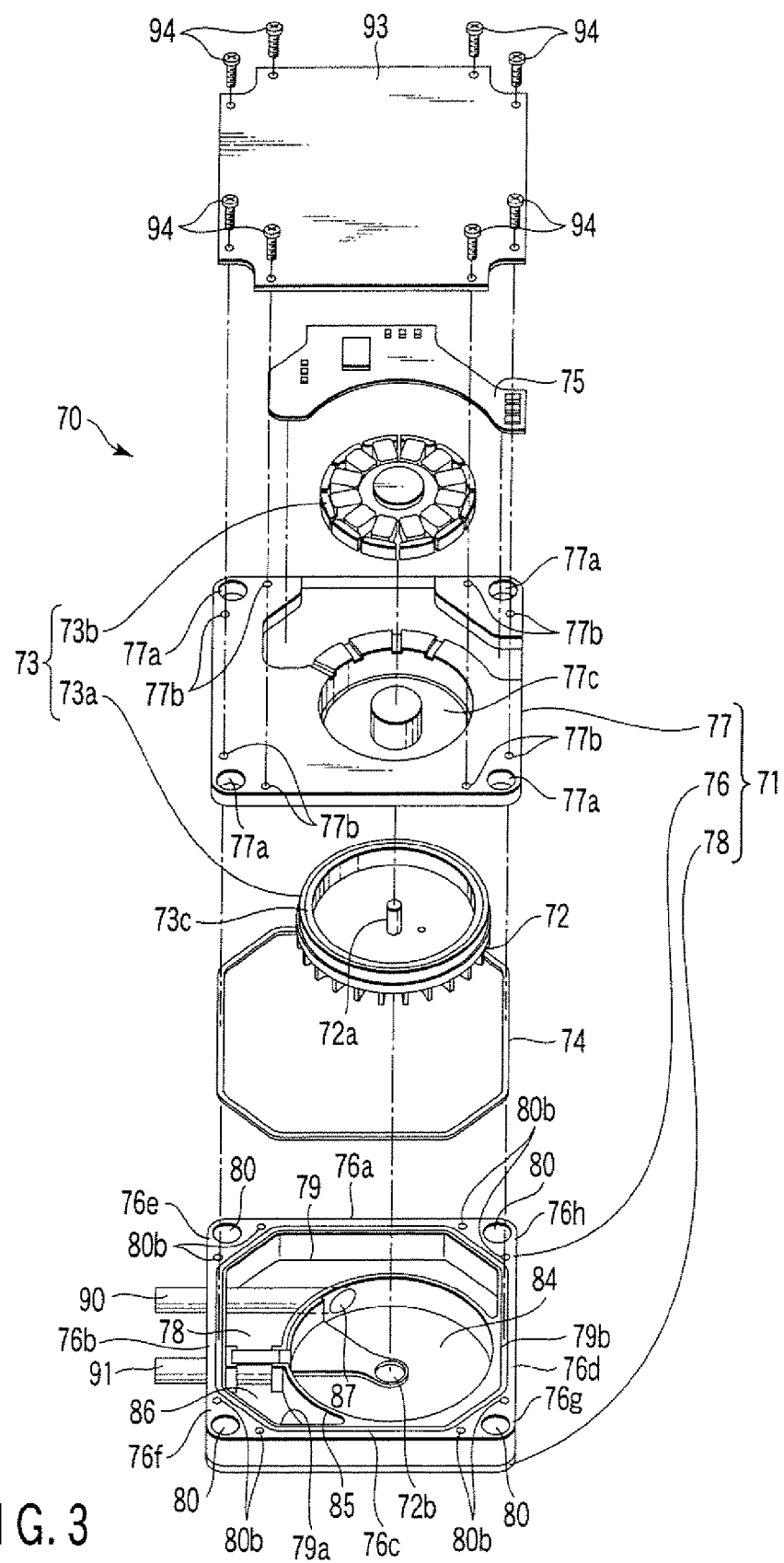
FIG. 3 is an exploded perspective view of a pump.

As shown in FIG. 3, the pump 70 comprises a pump housing 71, an impeller 72, a motor 73, and a control board 75. The pump 70 is an example of a heat-receiving apparatus. But, a heat-receiving apparatus is not limited to a pump. For example, a heat sink may be used as a heat-receiving apparatus. A heat sink has a function of cooling the CPU 24, for example a heat-generating body. A heat sink is not limited to using a liquid refrigerator when cooling a heat-generating body.

Figure 4:
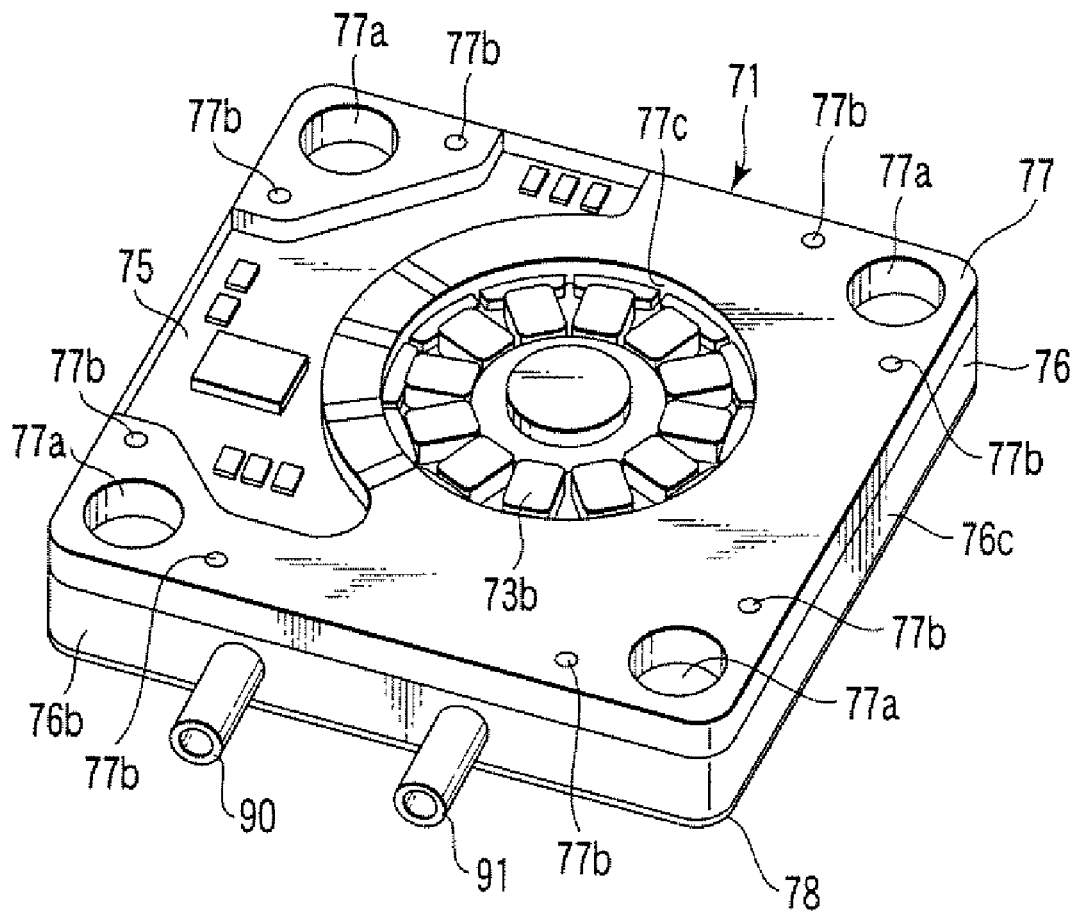
FIG. 4 is a perspective view of a pump housing of a pump.

The pump housing 71 is an example of housing. As shown in FIG. 4, the pump housing 71 comprises a housing body 76, a top cover 77 and a heat-receiving plate 78.

Figure 5:
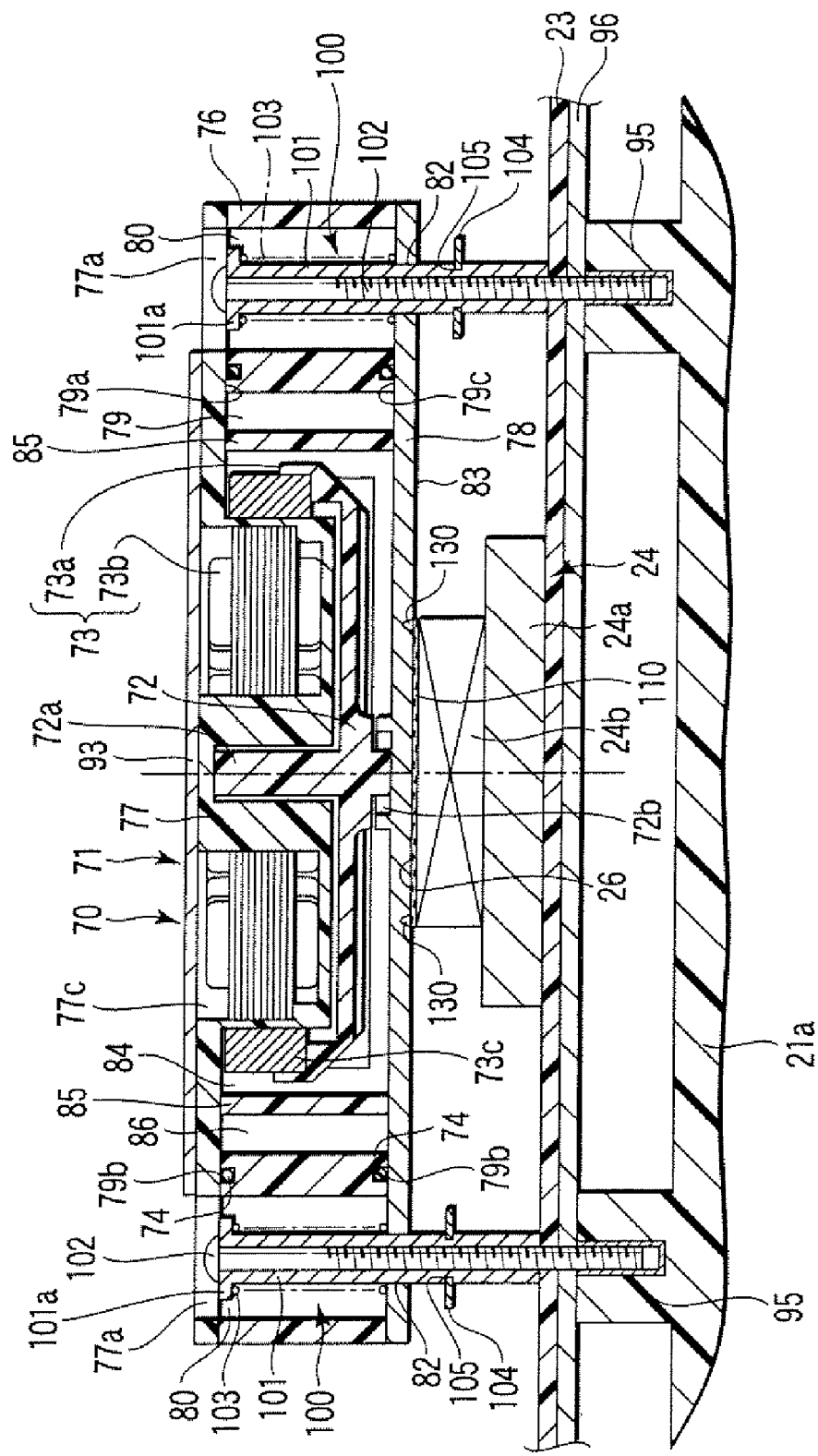
FIG. 5 is sectional view of the pump taken along lines F5-F5 in FIG. 2.

The housing body 76 is shaped as a flat rectangular parallelepiped. The housing body 76 is made of synthetic resin. As shown in FIG. 5, the housing body 76 has a housing part 79 which penetrates from the upper end surface to the lower end surface.

Figure 6:
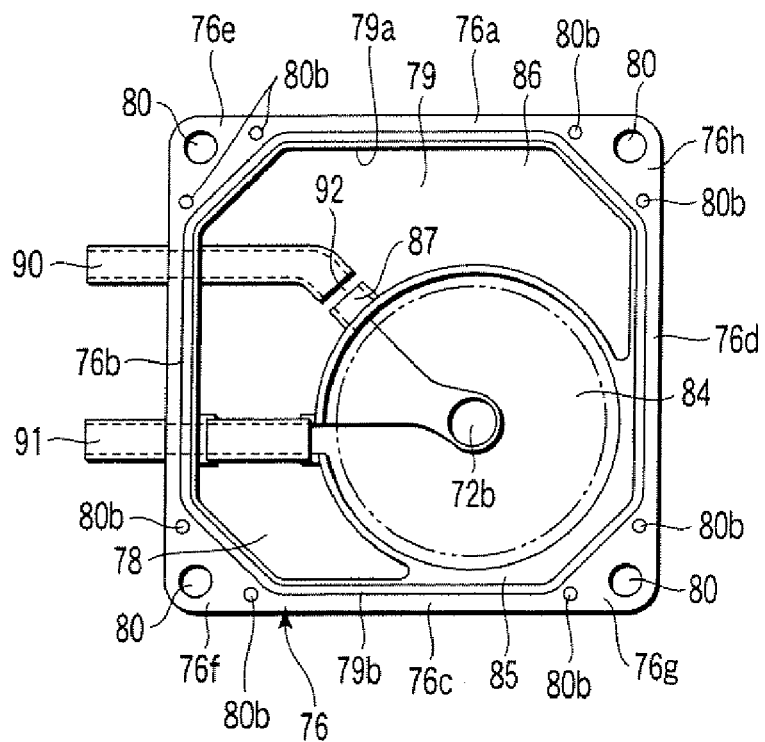
FIG. 6 is a plan view of a housing body.

As shown in FIG. 6, the housing part 79 is defined by the inside surfaces of four sidewalls 76a-76d and four substantially triangular corners 76e-76h of the housing body 76. Thus, the housing part 79 is shaped as a flat octagon.

A groove 79b is formed on the upper end surface of the housing body 76, that is, on the upper end surface of the sidewalls 76a-76d and at the corners 76e-76h. An O-ring 74 is fitted in the groove 79b. The upper ends of the sidewalls 76a-76d and corners 76e-76h define the upper opening 79a of the housing part 79.

As shown in FIG. 5 and FIG. 6, a first through hole 80 is formed at the corners 76e-76h. The first through hole 80 penetrates the housing body 76 in the longitudinal direction. As shown in FIG. 6, a screw receiving part 80b is formed on both sides of the first through hole 80 on the upper end surface of the housing body 76. A groove 79b is formed on the lower end surface of the housing body 76, surrounding the housing part 79. The O-ring 74 is fitted in the groove 79b.

The heat-receiving plate 78 is large enough to cover the whole lower end surface of the housing body 76. The heat-receiving plate 78 is fixed to the lower end surface of the housing body 76. The heat-receiving plate 78 has the function as a bottom wall of the housing part 79. As the O-ring 74 is provided in the lower end surface of the housing body 76, the heat-receiving plate 78 closes a lower opening 79c of the housing part 79 in a liquid-tight manner. The heat-receiving plate 78 is made of metal material with high thermal conductivity, such as copper. Copper is an example of the material of the heat-receiving plate 78. The heat-receiving plate 78 is an example of the heat-receiving part.

The heat-receiving plate 78 has a second through hole 82 at the position corresponding to the first through hole 80. The second through hole 82 is made smaller than the first through hole 80. In the heat-receiving plate 78, the side opposite to the housing body 76 is a heat-receiving surface 83 to receive heat from the CPU 24. The heat-receiving surface is formed flat.

In the heat-receiving plate 78, the side faced to the inside of the housing part 79 is provided with a partition wall member 85 to isolate a plane circular pump chamber 84 from the housing part 79. As shown in FIG. 6, the partition wall member 85 is shifted to the corner 76g. Thus, the pump chamber 84 is shifted to the corner 76g of the housing part 79. The position of the partition wall member 85 is not limited to this.

The inside of the housing part 79 is divided into the pump chamber 84 and reserve tank 86 by the partition wall member 85. The pump chamber 84 is formed inside the partition wall member 85. The reserve tank 86 is formed outside the partition wall member 85.

As shown in FIG. 6, the partition wall member 85 has a connecting opening 87 connecting the inside of the reserve tank 86 to the inside of the pump chamber 84. The housing body 76 has an intake pipe 90 and a discharge pipe 91. The upstream end of the intake pipe 90 is projected outward from the sidewall 76b of the housing body 76. The downstream end of the intake pipe 90 is opened to the inside of the reserve tank 86, and faced to the connecting opening 87.

A gap 92 is formed between the connecting opening 87 and the downstream end of the intake pipe 90. The gap 92 has an air-liquid separating function to separate bubbles in the liquid refrigerant. Even if the position of the pump 70 is changed in any direction, the gap 92 is always positioned under the liquid surface of the liquid refrigerant stored in the reserve tank.

The downstream end of the discharge pipe 91 is projected outward from the sidewall 76b of the housing body 76. The upstream end of the discharge pipe 91 is opened to the inside of the pump chamber 84, penetrating through the partition wall member 85.

As shown in FIG. 4, a top cover 77 is provided above the housing body 76, covering the upper opening 79a of the housing part 79 of the housing body 76. The cover is made of synthetic resin. At a corner of the top cover 77, a hole 77a is formed at the position corresponding to the first through hole 80. When the top cover 77 is laid on the housing body 76, the internal circumference surface of the hole 77a is continued to the internal circumference surface of the first through hole 80. A screw hole 77b is provided on both sides of the hole 77a. The screw hole 77b is connected to the screw receiving part 80. A female thread, for example, is formed in the screw receiving part 80b.

The top cover 77 is fixed to the housing body 76 with a screw 94. The screw 94 is inserted into the screw receiving part 80b of the housing body 76 through the screw hole 77b of the top cover 77. Thus, the top cover 77 is fixed to the housing body 76.

The O-ring 74 is provided around the upper opening 79a of the housing part 79. Thus, the top cover 77 is provided on the upper end surface of the housing body 76, and closes the upper opening 79a of the housing part 79 in a liquid-tight manner.

As shown in FIG. 3, the impeller 72 is contained in the pump chamber 84. The impeller 72 is shaped like a disk, and has a rotation shaft 72a at the center of rotation. The rotation shaft 72a is located over the heat-receiving plate 78 and top cover 77, and supported rotatably by the heat receiving plate 78 and top cover 77. The heat-receiving plate 78 is provided with a support base 72b to support the rotation shaft 72a.

The motor 73 has a rotor 73a and a stator 73b. The rotor 73a is shaped like a ring. The rotor 73a is fixed coaxially to the upper surface of the impeller 72, and contained in the pump chamber 84. The inside of the rotor 73a is formed with a magnet 73c composed of several positive and negative poles magnetized alternately. The rotor 73a is rotated as one unit with the impeller 72.

The stator 73b is placed in a recess 77c formed on the upper surface of the top cover 77. The recess 77c is sunk into the inside of the rotor 73a. Thus, the stator 73b is housed coaxially in the inside of the rotor 73a.

The control board 75 is supported on the upper surface of the top cover 77. The control board 75 is electrically connected to the stator 73b, and controls the motor 73. For example, when the portable computer 10 is turned on, the stator 73b is energized at the same time. When the stator 73b is energized, a rotating magnetic field is generated in the peripheral direction of the stator 73b. The magnetic field is magnetically combined with the magnet 73c fitted in the rotor 73a. As a result, torque is generated between the stator 73b and magnet 73c, along the peripheral direction of the rotor 73a. Thus, the impeller 72 is rotated.

A back plate 93 is provided on the upper surface of the top cover 77. The back plate 93 covers and hides the stator 73b and control board 75. The back plate 93 has the function to prevent leakage of the liquid refrigerant seeping from the pump housing 71.

The back plate 93 is fixed to the pump housing 71 with the screw 94. If the liquid refrigerant does not seep from the top cover 77, the back plate 93 can be omitted.

As shown in FIG. 2 and FIG. 5, the pump 70 is placed on the printed circuit board 23 so that the heat-receiving surface 83 covers the CPU 24 from the upper direction. In this embodiment, the pump 70 is placed on the printed circuit board 23 so that the center of the heat-receiving surface 83 is placed on the center portion 26e of the upper surface 26 of the IC chip 24b.

Figure 7:
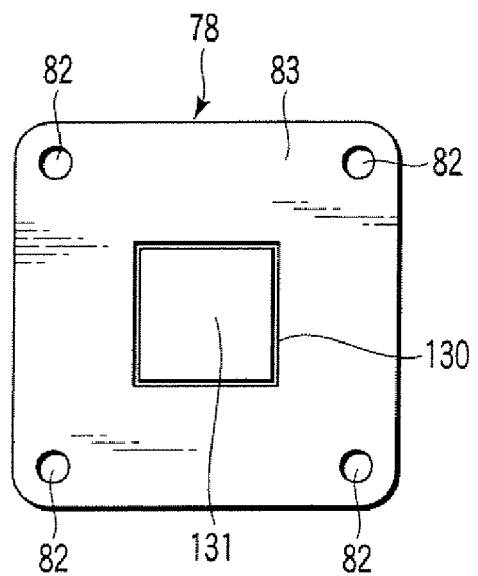
FIG. 7 is a plan view of a heat-receiving surface.

As shown in FIG. 7, a guide 130 is provided on the heat-receiving surface 83. In the heat-receiving surface 83, the guide 130 defines an opposite area 131 facing to the upper surface 26 of the IC chip 24b. The guide 130 indicates the whole outer edge of the opposite area 131, but not limited to this. For example, the guide 130 may indicate only a part of the outer edge of the opposite area 131.

As shown in FIG. 2, center portion 131a of the opposite area 131 is equal to the center portion of the heat-receiving surface 83. The center portion 131a of the opposite area 131 and the center portion 26e of the upper surface 26 of the IC chip 24b are opposite to each other. The opposite area 131 is opposite to the position away from the rotation shaft 72a of the impeller 72 in the pump chamber 84. The speed of a running fluid of the liquid refrigerant is fast at the position away from the rotation shaft 72a of the impeller 72 in the pump chamber 84.

If the heat-receiving plate 78 is molded by contour punching, the guide 130 is formed together. A die used for the contour punching is provided with a convex corresponding to the outer edge of the opposite area 131. Thus, the convex of the die bites the outer edge of the opposite area 131 of the heat-receiving surface 83, and forms a groove. This groove serves as a guide 130.

The method of forming the guide 130 by using a die is just an example. The guide forming method is not limited to this. The guide 130 may also by drawn in the whole or a part of the outer edge of the opposite area 131, or in the whole area of the opposite area 131 by another printing means. As a printing means, there is a plate formed with holes corresponding to the whole or a part of the outer edge of the opposite area 131, or the whole area of the opposite area 131. FIG. 5 and FIG. 7 show the groove-like guide 130 formed by using a die. The guide 130 is not limited to a solid line. It may also be like a broken line.

As shown in FIG. 5, the bottom wall 21a of the first housing 21 has a boss 95 at the position corresponding to the first through hole 80 at each corner of the pump housing 71. The boss 95 is projected upward from the bottom wall 21a. At the front end surface of the boss 95, the printed circuit board 23 is laid on through a reinforcement plate 96.

The portable computer 10 has a fixing mechanism 100. The fixing mechanism 100 has the function to fix the pump 70 to the bottom wall 21a of the first housing 21. The fixing mechanism 100 has a plurality of inserts 101, screws 102, coil springs 103 and C-rings 104.

The insert 101 is shaped cylindrical to be able to insert into the second through hole 82. The insert 101 has an extension 101a at one end. The extension 101a is extended from the outer circumference of the insert 101 toward the outside in the horizontal direction along the peripheral direction. The extension 101a is large enough to hang on the periphery of the second through hole 82. In the outer circumference of the other end of the insert 101, a groove 105 is formed along the circumference. The coil spring 103 is large enough to contain the insert 101 inside.

The fixing mechanism 100 fixes the pump 70 to the first housing 21 as described below. First, the insert 101 is inserted into each coil spring 103. Then, the insert 101 is inserted into the hole 77a of the top cover 77 from the end portion of the groove 105. The insert 101 is pressed in until the end portion of the groove 105 penetrates the second through hole 82. The coil spring 103 hangs on the periphery of the second through hole 82.

When the groove 105 penetrates the second through hole 82, the C-ring 104 is fitted in the groove 105. Thus, the insert 101 is fixed to the pump 70 in the state that the extension 101a is energized by the coil spring 103.

Then, the grease 110 is applied to the inside of the opposite area 131 by referring to the guide 130 of the heat-receiving surface 83. The grease 110 is an example of heat-conducting member. As another heat-conducting member, there is a cool sheet. The grease 110 can be applied by a dispenser, or by printing using a plate formed with the holes corresponding to the opposite area 131. The grease applying method is not limited to these two.

Then, the front end portion of the groove 105 side of each insert 101 is placed on each boss 95. Thus, the pump 70 is placed on the CPU 24 in the state that the opposite area 131 and the upper surface 26 of IC chip 24b are faced to each other.

Then, the screws 102 are inserted one by one into each insert 101. Each screw 102 penetrates the insert 101, and is screwed into the boss 95. Thus, the insert 101 is fixed to the printed circuit board 23. The opposite area 131 of the heat-receiving surface 83 is pressed to the upper surface 26 of the IC chip 24b by the elastic force of the coil spring 103. Therefore, the heat-receiving surface 83 is securely and thermally connected to the IC chip 24b through the grease 110.

As shown in FIG. 2, the circulation route 120 has a first pipe 121, a second pipe 122, and a pipe constituting the radiation body 51 of the heat-radiating part 50. The first pipe 121 connects the discharge pipe 91 of the pump housing 71 to the refrigerant entrance 53 of the heat-radiating part 50. The second pipe 122 connects the intake pipe 90 of the pump housing 71 to the refrigerant exit of the heat-radiating part 50.

Thus, the liquid refrigerant is circulated between the pump 70 and heat-radiating part 50 through the first and second pipes 121 and 122. The pipe constituting the radiation body 51 of the heat-radiating part 50 forms a part of the circulation route 120 as well as constituting the heat-radiating part 50. Namely, the circulation route 120 is thermally connected to the heat-radiating part 50.

Liquid refrigerant is filled in the pump chamber 84 of the pump 70, reserve tank 86, heat-radiating part 50 and circulation route 120.

Next, an explanation will be given of the operation of the cooling apparatus 40.

The IC chip 24b of the CPU 24 generates heat during operation of the portable computer 10. The heat generated by the IC chip 24b is transmitted to the heat-receiving surface 83. Since the reserve tank 86 and the pump chamber 84 of the pump housing 71 are filled with liquid refrigerant, the liquid refrigerant absorbs much heat transmitted to the heat-receiving surface 83.

The stator 73b of the motor 73 is energized immediately when the portable computer 10 is turned on. Thus, torque is generated between the stator 73b and the magnet 73c of the rotor 73a. The rotor 73a is rotated with the impeller 72 by this torque. When the impeller 72 is rotated, the liquid refrigerant in the pump chamber 84 is pressurized and discharged from the discharge pipe 91. The liquid refrigerant is led to the heat-radiating part 50 through the first pipe 121. In the heat-radiating part 50, the heat absorbed by the liquid refrigerant is transmitted to the radiation body 51 and radiation fins 52.

When the impeller 62 of the electric fan 60 is rotated during operation of the portable computer 10, a cooling air is blown toward the heat-radiating part 50 from the exhaust port 61a of the fan casing 61. This cooling air passes through the radiation fins 52. Thus, the radiation body 51 and radiation fins 52 are cooled. Much of the heat transmitted to the radiation body 51 and radiation fins 52 is conveyed by the flow of the cooling air and exhausted from the vent 25 to the outside of the first housing 21.

The liquid refrigerant cooled by the heat-radiating part 50 is led to the intake pipe 90 of the pump housing 71 through the second pipe 122. The liquid refrigerant is exhausted from the intake pipe 90 to the inside of the reserve tank 86. The liquid refrigerant returned to the reserve tank 86 absorbs again the heat of the IC chip 24b.

As the connecting opening 87 and the downstream end of the intake pipe 90 are immersed in the liquid refrigerant stored in the reserve tank 86, the liquid refrigerant in the reserve tank 86 flows into the pump chamber 84 through the connecting opening 87.

The liquid refrigerant led into the pump chamber 84 absorbs again the heat of the IC chip 24b, and is sent to the heat-radiating part 50 through the discharge pipe 91. As a result, the heat generated by the IC chip 24b is sequentially transmitted to the heat-radiating part 50 through the circulating liquid refrigerant, and exhausted from the heat-radiating part 50 to the outside of the portable computer 10.

In the portable computer 10 constructed as explained above, the heat-receiving surface 83 has the guide 130. As the guide 130 is used as a reference when applying the grease 110, the grease 110 can be securely and efficiently applied to between the heat-receiving surface 83 and the upper surface 26 of the IC chip 24b. Namely, the IC chip 24b is securely and thermally connected to the heat-receiving surface 83. Therefore, unevenness in the cooling performance of the cooling apparatus 40 is reduced.

Further, as the guide 130 indicates the opposite area 131, the area to apply the grease 110 is defined more clearly.

The grease 110 is not applied to the upper surface 26 of the IC chip 24b of the CPU 24 packed on the printed circuit board 23. This eliminates a problem that application of grease 110 is interrupted by the electronic components packed around the CPU 24. Namely, The grease 110 can be efficiently applied to between the heat-receiving surface 83 and the upper surface 26 of the IC chip 24b.

The opposite area 131 of the heat-receiving surface 83 is faced to the position in the pump chamber where the speed of a running fluid of the liquid refrigerant is fast. Thus, the IC chip 24b is efficiently cooled.

Next, an explanation will be given of a guide according to a second embodiment of the present invention based on FIG. 8. Same reference numerals will be given to the same components as those of the first embodiment, and explanation of the same components of the first embodiment will be omitted.

In this embodiment, the structure of a guide is different from the first embodiment. Detailed explanation on this point will be given hereinafter.

As shown in FIG. 8, the guide 130 has markings 132 opposite to the corners 26a-26d of the upper surface 26 of the IC chip 24b. The guide 130 is not provided in the parts other than each marking 132. Namely, the guide 130 indicates the corners 26a-26d of the opposite area 131 by each marking 132. In this embodiment, the guide 130 indicates the opposite area 131 by displaying the corners 26a-26d.

In the second embodiment, the same effect as the first embodiment can be obtained. The guide 130 formed like a groove by using a die is shown in FIG. 8, but the guide is not limited to this. The guide 130 may be printed as shown in the first embodiment.

Next, an explanation will be given of a guide according to a third embodiment based on FIG. 9. Same reference numerals will be given to the same components as those of the first embodiment, and explanation of the same components of the first embodiment will be omitted.

In this embodiment, the structure of a guide is different from the first embodiment. Detailed explanation on this point will be given hereinafter.

As shown in FIG. 9, the heat-receiving surface 83 has a guide 133 instead of the guide 130. The guide 133 is provided at the position opposite to the center portion 26e of the upper surface 26 of the IC chip 24b. The guide 133 is shaped like a cross. The cross shape is an example of the guide 133. The guide 133 may be shaped like a point, for example.

As shown in the first embodiment, the guide 133 may be formed by using a die, or drawn by a printing means. FIG. 9 shows the guide 133 drawn by a printing means.

According to the third embodiment, when applying the grease 110 to the heat-receiving surface 83 by a dispenser, the dispenser can be easily positioned to the center portion 131a of the opposite area 131 by placing the dispenser along the guide 133. Namely, the grease 110 can be efficiently applied between the heat-receiving surface 83 and the upper surface 26 of the IC chip 24b. The outer edge of the opposite area 131 is indicated by a chain double-dashed line in FIG. 9.

Next, an explanation will be given of a guide according to a fourth embodiment of the present invention based on FIG. 10. Same reference numerals will be given to the same components as those of the first embodiment, and explanation of the same components of the first embodiment will be omitted.

In this embodiment, the structure of a guide is different from the first embodiment. Detailed explanation on this point will be given hereinafter.

As shown in FIG. 10, the heat-receiving surface 83 has a guide 200 instead of the guide 130. The guide 200 has a first guide 140 and a second guide 141. The first guide 140 indicates the whole outer edge area of the opposite area 131 of the heat-receiving surface 83. The first guide 140 may indicates a part of the outer edge of the opposite area 131. The first guide 140 is like a solid line, but not limited to this. For example, it may be like a broken line.

The second guide 141 is located at the center portion 131a of the opposite area 131. Namely, the second guide 141 is opposite to the center portion 26e of the upper surface 26 of the IC chip 24b. The second guide 141 is shaped like a cross. The cross shape is an example. For example, it may be a point.

The first and second guides 140 and 141 may be formed by using a die, as shown in the first embodiment. They may also be drawn by a printing means. FIG. 10 shows the grove-like first guide 140 and second guide 141 formed by using a die.

When applying the grease 110 to the opposite area 131 of the heat-receiving surface 83, the grease 110 may be applied by using a dispenser as shown in the first embodiment. The grease 110 may also be applied just like printing by a plate formed with the holes corresponding to the opposite area 131.

According to the fourth embodiment, in addition to the same effect as the first embodiment, when the grease 110 is applied by a dispenser, the dispenser can be easily positioned to the center portion 131a of the opposite area 131 by placing the dispenser along the second guide 141. Namely, the grease 110 can be efficiently applied to between the heat-receiving surface 83 and the upper surface 26 of the IC chip 24b.

Next, an explanation will be given of a guide according to a fifth embodiment of the present invention based on FIG. 11. Same reference numerals will be given to the same components as those of the fourth embodiment, and explanation of the same components of the first embodiment will be omitted.

In this embodiment, the structure of a guide is different from the fourth embodiment. Detailed explanation on this point will be given hereinafter.

Figure 11:
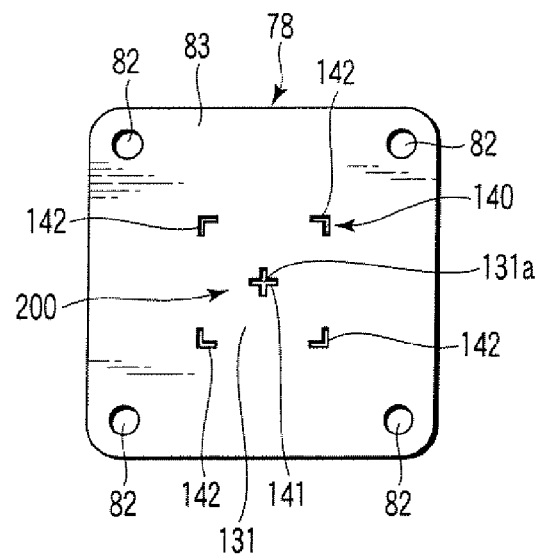
FIG. 11 is a plan view of a heat-receiving surface according to a fifth embodiment of the present invention.

As shown in FIG. 11, the guide 140 has markings 142 opposite to the corners 26a-26d of the upper surface 26 of the IC chip 24b. The guide 140 is not provided in the parts other than each marking 142. Namely, the guide 140 indicates the corners of the opposite area 131 by each marking 142. The first guide 140 indicates the opposite area 131 by displaying the corners 26a-26d. In the fifth embodiment, the same effect as the fourth embodiment can be obtained.

Next, an explanation will be given of a guide according to a sixth embodiment of the present invention based on FIG. 12. Same reference numerals will be given to the same components as those of the first embodiment, and explanation of the same components of the first embodiment will be omitted.

In this embodiment, the structure of a guide is different from the first embodiment. Detailed explanation on this point will be given hereinafter.

Figure 12:
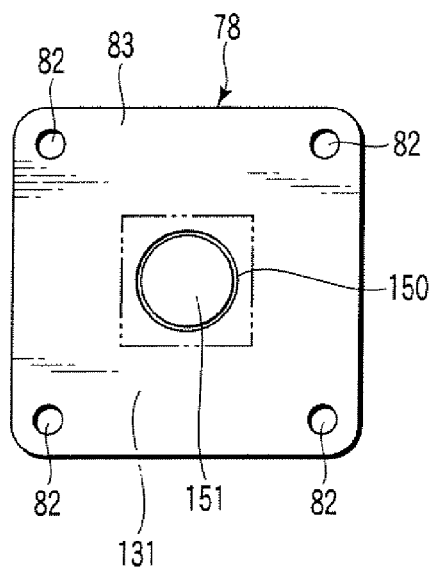
FIG. 12 is a plan view of a heat-receiving surface according to a sixth embodiment of the present invention.

As shown in FIG. 12, the heat-receiving surface 83 has a guide 150 instead of the guide 130. The guide 150 indicates the whole outer edge area of the application area 151. The guide 150 may indicates a part of the outer edge of the application area 151. The guide 150 may be like a broken line, not like a solid line. The application area 151 may be formed by using a die, as shown in the first embodiment, or drawn by a printing means. FIG. 12 shows the groove-like guide 150 formed by using a die.

The application area 151 is a circular plane, and indicates the area to apply the grease 110.

The application area 151 is an example of an area where a heat-conducting member is provided. The application area 151 is smaller than the opposite area 131. In FIG. 12, the opposite area 131 is indicated by a chain double-dashed line.

The application area 151 has a size that assumes that the grease 110 applied to the application area 151 is extended over the whole opposite area 131 by being spread between the heat-receiving surface 83 and the upper surface 26 of the IC chip 24b, when the pump 70 is fixed to the printed circuit board 23.

The grease 110 may be applied to the application area 151 by a dispenser as shown in the first embodiment, or by printing by using a plate formed with the holes corresponding to the application area 151. The application area 151 is not limited to the plane circular shape.

According to the sixth embodiment, the application area 151 is indicated by the guide 150, and the grease 110 can be efficiently applied between the heat-receiving surface 83 and the upper surface 26 of the IC chip 24b by referring to the guide 150. As the application area 151 has a size that assumes that the grease 110 is spread, waste of grease 110 can be reduced.

Next, an explanation will be given of a guide according to a seventh embodiment of the present invention based on FIG. 13. Same reference numerals will be given to the same components as those of the fourth embodiment, and explanation of the same components of the first embodiment will be omitted.

In this embodiment, the structure of a guide and the position of a partition wall member are different from the fourth embodiment. Detailed explanation on these points will be given hereinafter.

Figure 13:
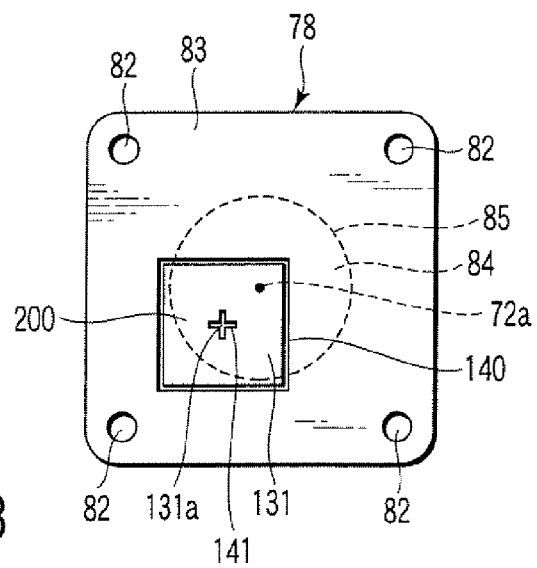
FIG. 13 is a plan view of a heat-receiving surface according to a seventh embodiment of the present invention.

As shown in FIG. 13, the partition wall member 85 is provided so that the rotation shaft 72a of the impeller 72 in the pump chamber 84 is located at the center portion of the heat-receiving plate 78. The pump 70 is fixed to the printed circuit board 23 so that the position away from the rotation shaft 72a of the impeller 72 in the pump chamber 84 is faced to the upper surface 26 of the IC chip 24b. At the position away from the rotation shaft 72a of the impeller 72 in the pump chamber 84, the speed of a running fluid of the liquid refrigerant is fast.

As a result, the opposite area 131 is provided at the position where the center portion 131a is displaced from the center portion of the heat-receiving surface 83. Accordingly, the first and second guides 140 and 141 are provided at the positions shifted to the corner of the heat-receiving surface 83.

In the seventh embodiment, even if the upper surface 26 of the IC chip 24b is faced to the position shifted to the corner of the heat-receiving surface 83, the grease 110 can be efficiently applied between the heat-receiving surface 83 and the upper surface 26 of the IC chip 24b by referring to the first and second guides 140 and 141. The opposite area 131 faces the position in the pump chamber 84 where the speed of a running fluid of the liquid refrigerant is fast. Thus, the IC chip 24b is efficiently cooled.

Further, in the seventh embodiment, the heat-receiving surface 83 has the first and second guides 140 and 141. The guide is not limited to them. For example, the guide may indicate the whole or a part of the outer edge of the opposite area 131. The guide may also indicate only the center portion 131a of the opposite area 131. The guide may also indicate only the position opposite to the center part 26e of the upper surface 26 of the IC chip 24b. The guide may also indicate the whole or a part of the outer edge of the application area 151, as shown in sixth embodiment.

The pump 70 is not limited to the structure having the heat-receiving plate 78 as a heat-receiving part connected thermally to the IC chip 24b, as shown in the first to seventh embodiments. For example, the pump may be formed with a bottom having a bottom wall as a heat-receiving part, by using metal material with excellent thermal conductivity, such as aluminum alloy.

In this case, a guide is provided on the bottom wall of the housing body 76. If the housing body 76 is molded by die casting, the guide may be formed together with the housing body 76. In this case, as shown in the above first to seventh embodiments, a die used for molding the housing 76 has a convex corresponding to the whole or a part of the outer edge of the opposite area 131, the center portion 131a of the opposite area 131, the corners 26a-26d of the upper surface 26 of the IC chip 24b, the center portion 26e of the upper surface 26 of the IC chip 24b, or the whole or a part of the outer edge of the application area 151. With this structure, the depth of the guide groove can be adjusted simply by cutting away the convex. Namely, it is unnecessary to change the die greatly when adjusting the depth of the guide groove. This is applied also to the case that a guide is formed on the heat-receiving plat 78 by using a die.

If the housing body 76 and heat-receiving part are molded as one body by die casting, a die may be shaped to have a recess instead of a convex to form a guide. With this structure, a guide formed on the heat-receiving surface 83 has a shape to project toward the CPU 24.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A heat-receiving apparatus comprising:
   a heat-receiving surface;
   a heat-generating body thermally connected to the heat-receiving surface, the heat-generating body having a heat-connecting surface, the heat-connecting surface (i) being thermally connected to the heat-receiving surface and (ii) having four corners; and
   a guide being provided on the heat-receiving surface and indicating corners of an outer edge of an area opposite to the heat-connecting surface on the heat-receiving surface.

2. The heat-receiving apparatus according to claim 1, wherein the guide indicates the whole outer edge of the area opposite to the heat-generating body on the heat-receiving surface.

3. The heat-receiving apparatus according to claim 1, wherein a heat-conducting member is interposed between the heat-receiving surface and heat-generating body, and the guide indicates an area in which the heat-conducting member is provided.

4. The heat-receiving apparatus according to claim 1, wherein the guide is formed as a groove on the heat-receiving surface.

5. The heat-receiving apparatus according to claim 1, wherein the guide is printed on the heat-receiving surface.

6. A heat-receiving apparatus comprising:
   a heat-receiving surface being thermally connected to a heat-generating body; and
   a guide being provided on the heat-receiving surface and opposite to a center portion of the heat-generating body.

7. The heat-receiving apparatus according to claim 6, wherein a heat-conducting member is interposed between the heat-receiving surface and heat-generating body, and the guide indicates an area in which the heat-conducting member is provided.

8. The heat-receiving apparatus according to claim 6, wherein the guide is formed as a groove on the heat-receiving surface.

9. The heat-receiving apparatus according to claim 6, wherein the guide is printed on the heat-receiving surface.

10. The heat-receiving apparatus according to claim 1, wherein the guide mitigates displacement of the position of the heat-generating body relative to the heat receiving surface.

11. Electronic equipment comprising:
    a housing including a heat-generating body;
    a heat-receiving part including a heat-receiving surface and a guide, the heat-receiving surface being thermally connected to the heat-generating body, the heat-generating body including a heat-connecting surface, the heat-connecting surface having four corners and being thermally connected to the heat-receiving surface, the guide being provided on the heat-receiving surface and indicating corners of an outer edge of an area apposite to the heat-connecting surface on the heat-receiving surface; and
    a heat-radiating part which radiates the heat transmitted to the heat-receiving part.

12. The electronic equipment according to claim 11, wherein the guide indicates the whole outer edge of the area opposite to the heat-generating body on the heat-receiving surface.

13. The electronic equipment according to claim 11, wherein a heat-conducting member is interposed between the heat-receiving surface and heat-generating body; and the guide indicates an area in which the heat-conducting member is provided at the heat-receiving surface.

14. The electronic equipment according to claim 11, wherein the guide mitigates displacement of the position of the heat-generating body relative to the heat-receiving surface.

15. Electronic equipment comprising:
    a heat-generating body;
    a heat-radiating part;
    a circulation route which is thermally connected to the heat-radiating part, and in which a refrigerant is circulated;
    a pump which adapted to supply the refrigerant to the circulation route, the pump includes a housing and incorporates an impeller and a motor, the housing including a heat-receiving part and a pump chamber, said heat-receiving part including a heat-receiving surface and a guide, said impeller being provided in the pump chamber, the motor being provided to rotate the impeller, said heat-receiving surface being thermally connected to the heat-generating body, said heat-receiving surface being thermally connected to the heat-generating body, said heat-generating body having a heat-connecting surface, said heat-connecting surface being thermally connected to said heat-receiving surface, said heat-connecting surface having four corners, said guide being provided on said heat-receiving surface said heat-receiving surface.

16. The electronic equipment according to claim 15, wherein a heat-conducting member is interposed between the heat-receiving surface and heat-generating body; and the guide indicates an area in which the heat-conducting member is provided at the heat-receiving surface.

17. The electronic equipment according to claim 15, wherein the guide mitigates displacement of the position of the heat-generating body relative to the heat-receiving surface.

18. Electronic equipment comprising:
a housing having a heat-generating body;
a heat-radiating part;
a circulation route which is thermally connected to the heat-radiating part, and in which a refrigerant is circulated;
a pump adapted to supply the refrigerant to the circulation route, the pump includes a housing and incorporates an impeller and a motor, the housing having a heat-receiving part and a pump chamber, the heat-receiving part including a heat-receiving surface and a guide, said impeller being provided in the pump chamber, and said motor being provided to rotate the impeller, said heat-receiving surface being thermally connected to the heat-generating body, and said guide being opposite to a center portion of the heat-generating body.

19. The electronic equipment according to claim 18, wherein a heat-conducting member is interposed between the heat-receiving surface and heat-generating body and the guide indicates an area in which the heat-conducting member is provided at the heat-receiving surface.

20. The electronic equipment according to claim 18, wherein the guide mitigates displacement of the position of the heat-generating body relative to the heat-receiving surface.

* * * * *